(12) United States Patent
Nakakomi

(10) Patent No.: US 10,473,987 B2
(45) Date of Patent: Nov. 12, 2019

(54) DISPLAY DEVICE

(71) Applicant: Japan Display Inc., Minato-ku (JP)

(72) Inventor: Masaru Nakakomi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 23 days.

(21) Appl. No.: 15/839,910

(22) Filed: Dec. 13, 2017

(65) Prior Publication Data

US 2018/0180950 A1    Jun. 28, 2018

(30) Foreign Application Priority Data

Dec. 26, 2016 (JP) ................................ 2016-251598

(51) Int. Cl.
| | |
|---|---|
| *G02F 1/1343* | (2006.01) |
| *G02F 1/1335* | (2006.01) |
| *G02F 1/1362* | (2006.01) |
| *G02F 1/1345* | (2006.01) |
| *G02F 1/133* | (2006.01) |
| *G09G 3/36* | (2006.01) |
| *G02F 1/1368* | (2006.01) |

(Continued)

(52) U.S. Cl.
CPC ...... *G02F 1/134309* (2013.01); *G02F 1/1345* (2013.01); *G02F 1/1368* (2013.01); *G02F 1/13306* (2013.01); *G02F 1/133512* (2013.01); *G02F 1/136286* (2013.01); *G09G 3/3648* (2013.01); *G09G 3/3674* (2013.01); *G02F 2001/13685* (2013.01); *G02F 2001/133388* (2013.01); *G02F 2201/501* (2013.01); *G09G 2300/0426* (2013.01); *H01L 29/78645* (2013.01)

(58) Field of Classification Search
CPC .......... G02F 1/134309; G02F 1/13306; G02F 1/133512; G02F 1/1345; G02F 1/136286; G02F 1/1368; G02F 2001/133388; G02F 2001/13685; G02F 2201/501; G09G 3/3648; G09G 3/3674; G09G 2300/0426; H01L 29/78645

See application file for complete search history.

(56) References Cited

U.S. PATENT DOCUMENTS

| | | | |
|---|---|---|---|
| 2008/0055529 A1* | 3/2008 | Shirasaka | G02F 1/134309 349/143 |
| 2014/0368481 A1* | 12/2014 | Tomikawa | G09G 3/3614 345/205 |

FOREIGN PATENT DOCUMENTS

JP         2016-9046         1/2016

* cited by examiner

*Primary Examiner* — Nathanael R Briggs
(74) *Attorney, Agent, or Firm* — Oblon, McClelland, Maier & Neustadt, L.L.P.

(57) ABSTRACT

A display device capable of preventing deterioration in display quality caused by ions in a liquid crystal layer particularly by taking a measure against positive and negative ions is provided. A display device includes: a display region; a peripheral region outside of the display region; a light shielding layer overlapped on the peripheral region; a voltage supply wiring provided in the peripheral region; and first and second electrodes provided in the peripheral region and connected to the voltage supply wiring. The peripheral region includes first, second, third, and fourth regions. The first electrode is provided in any region among the first to fourth regions. The second electrode is provided in a region different from the region where the first electrode is formed among these regions. A polarity of a first voltage supplied to the first electrode is different from that of a second voltage supplied to the second electrode.

5 Claims, 13 Drawing Sheets

(51) Int. Cl.
*G02F 1/1333* (2006.01)
*H01L 29/786* (2006.01)

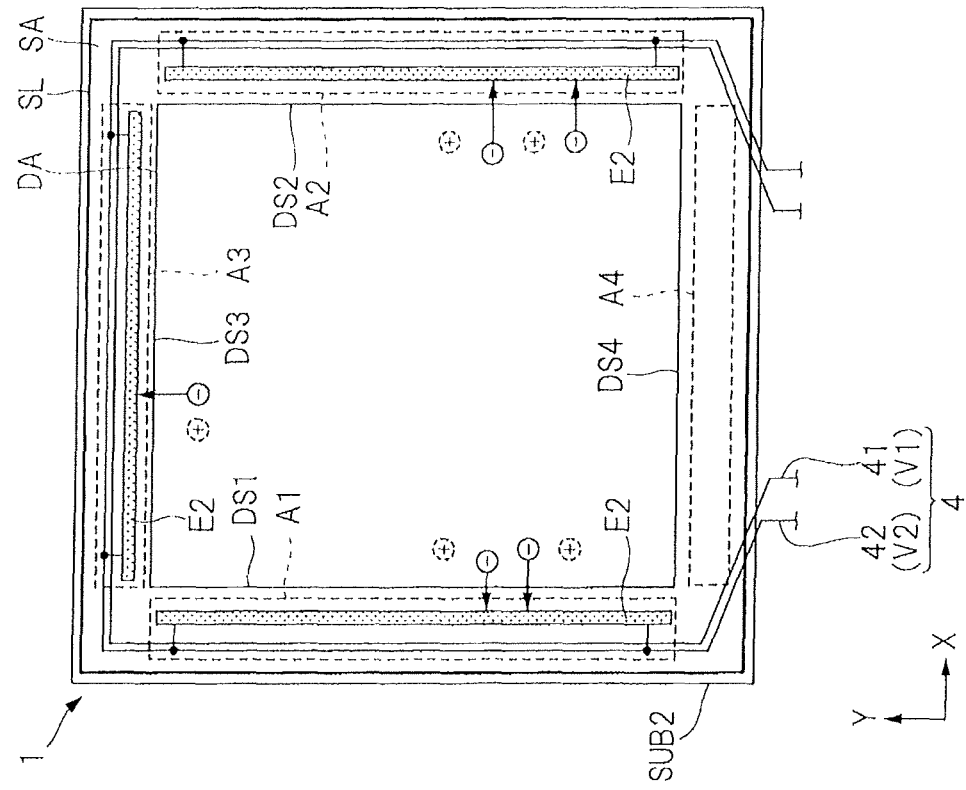
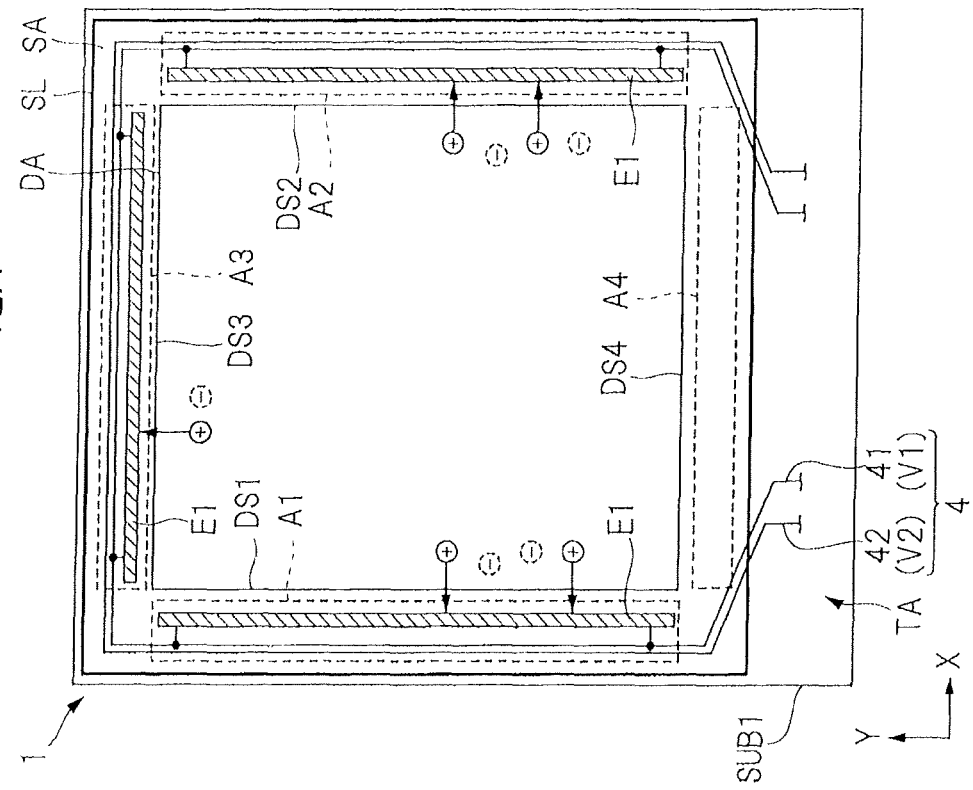

DISPLAY DEVICE

CROSS-REFERENCE TO RELATED APPLICATION

The present application claims priority from Japanese Patent Application No. 2016-251598 filed on Dec. 26, 2016, the content of which is hereby incorporated by reference into this application.

TECHNICAL FIELD OF THE INVENTION

The present invention relates to a display device.

BACKGROUND OF THE INVENTION

A liquid crystal display device has been widely spread as a display device, the liquid crystal display device including an array substrate on which a switching element and a pixel electrode are formed, a counter substrate facing the array substrate, and a liquid crystal layer disposed between the array substrate and the counter substrate.

RELATED ART DOCUMENT

Patent Document

Patent Document 1: Japanese Patent Application Laid-open Publication No. 2016-9046

SUMMARY OF THE INVENTION

In the liquid crystal display device as described above, it is known that an ion caused by an impurity and an ion eluted from a sealing material that bonds the array substrate to the counter substrate are mixed with the liquid crystal layer. When a density of the ions locally increases in the liquid crystal layer, an effective voltage applied to this part of the liquid crystal layer may decrease. Accordingly, brightness of this part decreases, and therefore, an influence of black unevenness and others may appear on a display image.

Furthermore, the generated ions have a positive polarity and a negative polarity. In general, a generated amount of the positive ions is large, and therefore, there is a liquid crystal display device capable of mainly capturing the positive ions. However, the negative ions also exist in the liquid crystal layer. Therefore, by the capture of only the positive ions, the remaining negative ions may concentrate around some wires or others having an electric charge of the positive polarity, which results in the black unevenness in some cases.

The present invention has been made in order to solve the above-described problems of the related art, and an object of the present invention is to provide a display device capable of preventing deterioration in display quality caused by ions existing in a liquid crystal layer by particularly taking a measure against both of positive and negative ions.

The summary of the typical aspects of the inventions disclosed in the present application will be briefly described as follows.

A display device according to an aspect of the present invention includes: a first substrate; a second substrate facing the first substrate; and a liquid crystal layer disposed between the first substrate and the second substrate. The display device includes: a display region; a peripheral region outside of the display region; a light shielding layer overlapped on the peripheral region; a voltage supply wiring provided in the peripheral region; and a first electrode and a second electrode provided in the peripheral region and connected to the voltage supply wiring. The peripheral region includes a first region, a second region, a third region, and a fourth region. The first electrode is provided in any region among the first to fourth regions. The second electrode is provided in a region different from the region where the first electrode is formed among the first to fourth regions. A polarity of a first voltage supplied to the first electrode is different from a polarity of a second voltage supplied to the second electrode.

Further, as another aspect, the peripheral region in the display device may further include a fifth region and a sixth region. The fifth region is a region at a corner between the first region and the third region. The sixth region is a region at a corner between the second region and the third region. The first electrode is provided in any region among the first to sixth regions. The second electrode is provided to a region different from the region where the first electrode is formed among the first to sixth regions. The polarity of the first voltage supplied to the first electrode is different from the polarity of the second voltage supplied to the second electrode.

A display device according to another aspect of the present invention includes: a first substrate; a second substrate facing the first substrate; and a liquid crystal layer disposed between the first substrate and the second substrate. The display device includes: a display region; a peripheral region outside of the display region; a light shielding layer overlapped on the peripheral region; a voltage supply wiring provided in the peripheral region; and a first electrode and a second electrode provided in the peripheral region and connected to the voltage supply wiring. The peripheral region includes a first region, a second region, a third region, a fourth region, a fifth region, and a sixth region. In at least each of the first to third regions, a plurality of the first electrodes and a plurality of the second electrodes are provided. In at least each of the fifth and sixth regions, either the first electrode or the second electrode is provided. The polarity of the first voltage supplied to the first electrode is different from the polarity of the second voltage supplied to the second electrode.

A display device according to still another aspect of the present invention includes: a first substrate; a second substrate facing the first substrate; and a liquid crystal layer disposed between the first substrate and the second substrate. The display device includes: a display region; a peripheral region outside of the display region; a light shielding layer overlapped on the peripheral region a voltage supply wiring provided in the peripheral region; and a first electrode and a second electrode provided in the peripheral region and connected to the voltage supply wiring. The peripheral region includes a first region, a second region, a third region, and a fourth region provided on the first substrate side, and a first region, a second region, a third region, and a fourth region provided on the second substrate side. The first electrode is provided in either one of the first to fourth regions provided on the first substrate side and the first to fourth regions provided on the second substrate side. The second electrode is provided in the other of the first to fourth regions provided on the first substrate side and the first to fourth regions provided on the second substrate side. The polarity of the first voltage supplied to the first electrode is different from the polarity of the second voltage supplied to the second electrode.

BRIEF DESCRIPTIONS OF THE DRAWINGS

FIG. 12A is a plan view schematically illustrating an example of a configuration of an electrode in a display device according to a fourth embodiment;

FIG. 12B is a plan view schematically illustrating the example of the configuration of the electrode in the display device according to the fourth embodiment.

Figure 1:
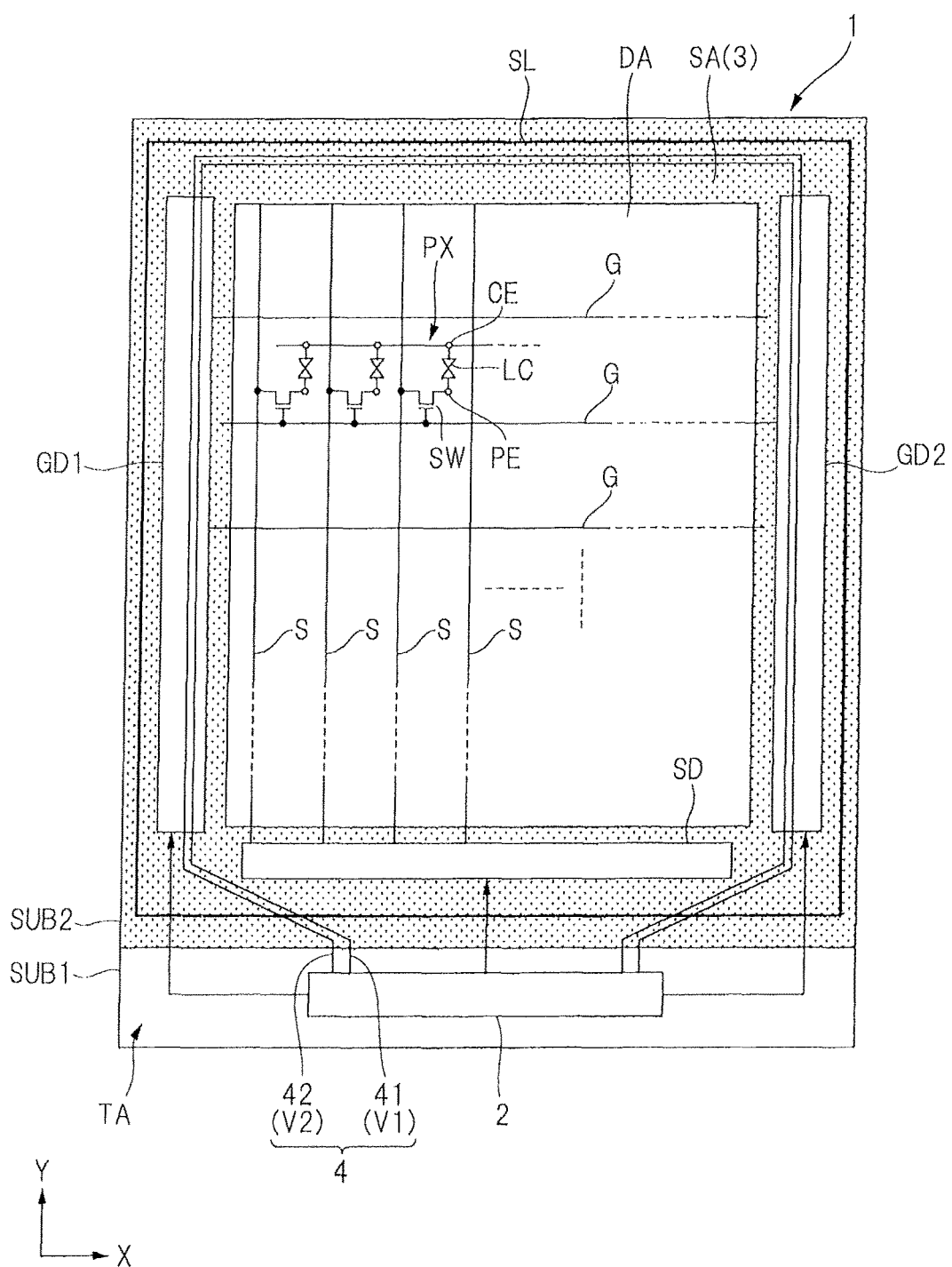
FIG. 1 is a plan view illustrating an example of a configuration of a display device according to a first embodiment.

DESCRIPTIONS OF THE PREFERRED
EMBODIMENTS

Embodiments of the present invention will be described below with reference to drawings.

Note that disclosure is merely one example, and appropriate modification with keeping the concept of the present invention which can be easily anticipated by those who skilled in the art is obviously contained in the scope of the present invention. Also, in order to make the description clear, the drawings are illustrated more schematically for a width, a thickness, a shape, and others of each portion than those in an actual aspect in some cases. However, they are merely examples, and do not limit the interpretation of the present invention.

In each drawing, the reference characters of the continuously-disposed same or similar elements are omitted in some cases. In the present specification and each drawing, the same or similar elements to those described earlier for the already-described drawings are denoted with the same or similar reference characters, and detailed description for them is appropriately omitted in some cases.

Also, in some drawings used in the embodiments, hatching is omitted even in a cross-sectional view so as to make the drawings easy to see in some cases. And, hatching is used even in a plan view so as to make the drawings easy to see in some cases.

First Embodiment

In the present first embodiment, a liquid crystal display device is disclosed as an example of the display device. However, note that the first embodiment does not exclude application of individual technical ideas disclosed in the present first embodiment to another type of the display device.

The display device according to the first embodiment is described with reference to FIGS. 1 to 7.

<Configuration of Display Device>

FIG. 1 is a plan view illustrating an example of a configuration of a display device 1 according to the first embodiment. The display device 1 includes a first substrate SUB1 (array substrate), and a second substrate SUB2 (counter substrate) facing the first substrate SUB1. The substrates SUB1 and SUB2 are bonded to each other by a sealing material SL. Between the substrates SUB1 and SUB2, a liquid crystal layer LC is enclosed into a space surrounded by the sealing material SL.

The display device 1 includes a display region DA, and a peripheral region SA outside of the display region DA. The first substrate SUB1 has an output region TA not facing the second substrate SUB2. On the output region TA, a driver integrated circuit (IC) 2 is mounted. The peripheral region SA is overlapped on a light shielding layer 3 formed on the second substrate SUB2 in a plan view.

The display device 1 includes: a first scanning driver GD1, a second scanning driver GD2, and a video driver SD. All of the drivers GD1, GD2, and SD are provided on, for example, the first substrate SUB1 in the peripheral region SA. In FIG. 1, the first scanning driver GD1 is located on a left side of the display region DA, and the second scanning driver GD2 is located on a right side of the display region DA. The video driver SD is located between the display region DA and the output region TA. Note that the display device 1 may also have only one scanning driver. Further, the video driver SD may also be provided outside of the display device 1 and be connected to the display device 1 through a flexible circuit board.

The display device 1 includes a plurality of scanning signal lines G, and a plurality of video signal lines S intersecting the respective scanning signal lines G. The scanning signal lines G extend in an X direction and are disposed side by side in a Y direction intersecting the X direction. The video signal lines S extend in the Y direction and are disposed side by side in the X direction. The X and Y directions intersect, for example, orthogonally each other. For example, an odd-numbered scanning signal line G from an upper edge in FIG. 1 among each of the scanning signal lines G is connected to the first scanning driver GD1, and an even-numbered scanning signal line G therefrom is connected to the second scanning driver GD2. Each of the video signal lines S is connected to the video driver SD. Each of the scanning drivers GD1 and GD2 supplies a scan signal to the corresponding scanning signal line G. The video driver SD supplies a video signal to each of the video signal lines S.

The display device 1 is provided with a voltage supply wiring 4 provided in the peripheral region SA. In the present first embodiment, the voltage supply wiring 4 includes a first power supply line 41, and a second power supply line 42. In the example of FIG. 1, each of the power supply lines 41 and 42 surrounds the display region DA and has both ends connected to the driver IC 2. In a plan view, the first power supply line 41 is located between the second power supply line 42 and the display region DA. In another example, the second power supply line 42 may also be located between the first power supply line 41 and the display region DA.

In the present first embodiment, the driver IC 2 supplies a first voltage V1 to the first power supply line 41, and supplies a second voltage V2 that is different from the first voltage V1 to the second power supply line 42. A power supply circuit that generates each of the voltages V1 and V2 may be provided to the display device 1 or may be provided outside of the display device 1.

For example, the first voltage V1 is a voltage VGL having a first polarity, and the second voltage V2 is a voltage VGH having a second polarity that is different from the first polarity. In the present first embodiment, it is assumed that the first polarity is negative and the second polarity is positive. Each of the scanning drivers GD1 and GD2 selectively supplies each of these voltages V1 and V2 to the scanning signal line G.

The display device 1 has many pixel regions PX partitioned by each of the scanning signal lines G and each of the video signal lines S. The pixel region PX is a region corresponding to a sub-pixel displaying a specific color such as red, green, blue, or white. The plurality of sub-pixels corresponding to different colors from one another constitutes one pixel capable of displaying a color.

Each of the pixel regions PX includes a switching element SW connected to the scanning signal line G and the video signal line S, and a pixel electrode PE connected to the switching element SW. The first voltage V1 is an off-voltage of the switching element SW, and the second voltage V2 is an on-voltage of the switching element SW. That is, when the second voltage V2 is supplied to a scanning signal line G corresponding to a switching element SW, the switching element SW is turned on. At this time, a video signal line S and a pixel electrode PE corresponding to this switching element SW are electrically connected to each other, and a video signal of this video signal line S is supplied to this pixel electrode PE. The pixel electrode PE to which the video signal has been supplied forms an electric field that acts on the liquid crystal layer LC with a common electrode CE which is provided across the plurality of pixel regions PX.

<Configuration of Scanning Driver>

Figure 2:
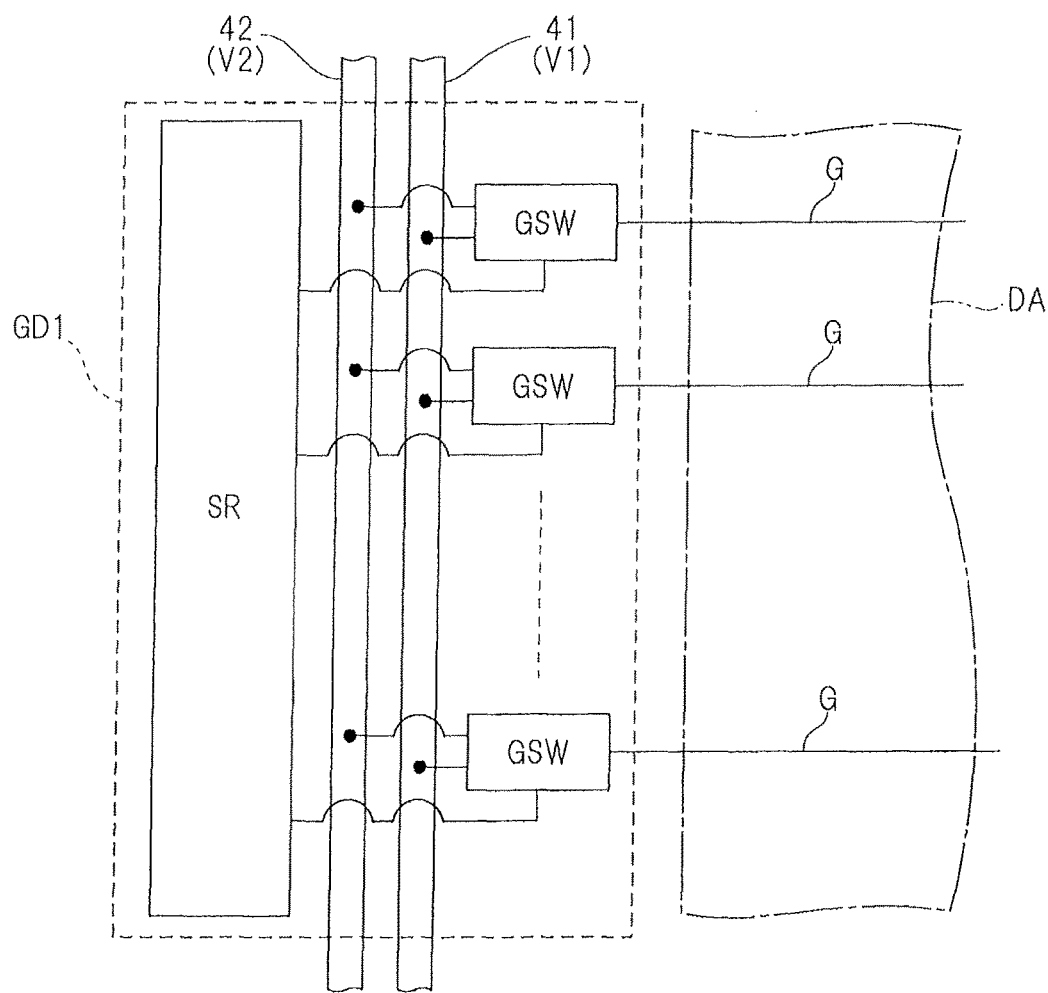
FIG. 2 is a view schematically illustrating an example of a configuration of a first scanning driver in the display device according to the first embodiment.

FIG. 2 is a view schematically illustrating an example of a configuration of the first scanning driver GD1 in the display device 1 according to the present first embodiment. The second scanning driver GD2 can take a configuration similar to that of the first scanning driver GD1 described herein.

The first scanning driver GD1 includes a shift register circuit SR, and a plurality of gate switch circuits GSW. To each of the gate switch circuits GSW, one of the scanning signal lines G is connected. In the example of FIG. 2, the first power supply line 41 and the second power supply line 42 extend between the shift register circuit SR and the gate switch circuits GSW.

The shift register circuit SR sequentially outputs a shift pulse to each of the gate switch circuits GSW. When the shift pulse is not input thereto, the gate switch circuit GSW outputs the first voltage V1, that is to be supplied to the first power supply line 41, to the corresponding scanning signal line G. On the other hand, when the shift pulse is input thereto, the gate switch circuit GSW outputs the second voltage V2, that is to be supplied to the second power supply line 42, to the corresponding scanning signal line G.

In the display device 1 having the configuration as described above, an ion caused by an impurity contained in the liquid crystal layer LC and an ion eluted from the sealing material SL may be mixed with the liquid crystal layer LC. It is known that such ions easily concentrate by the driving of the display device 1 at a corner of a region surrounded by the sealing material SL. When the concentrated ions affect the display region DA, an effective voltage of the liquid crystal layer LC decreases, and an influence such as black unevenness may appear on an image displayed on the display region DA.

The display device 1 according to the present first embodiment has a configuration for suppressing the deterioration in the display quality due to the ions in the liquid crystal layer LC. An example of this configuration is described below.

<Configuration of Electrode>

Figure 3:
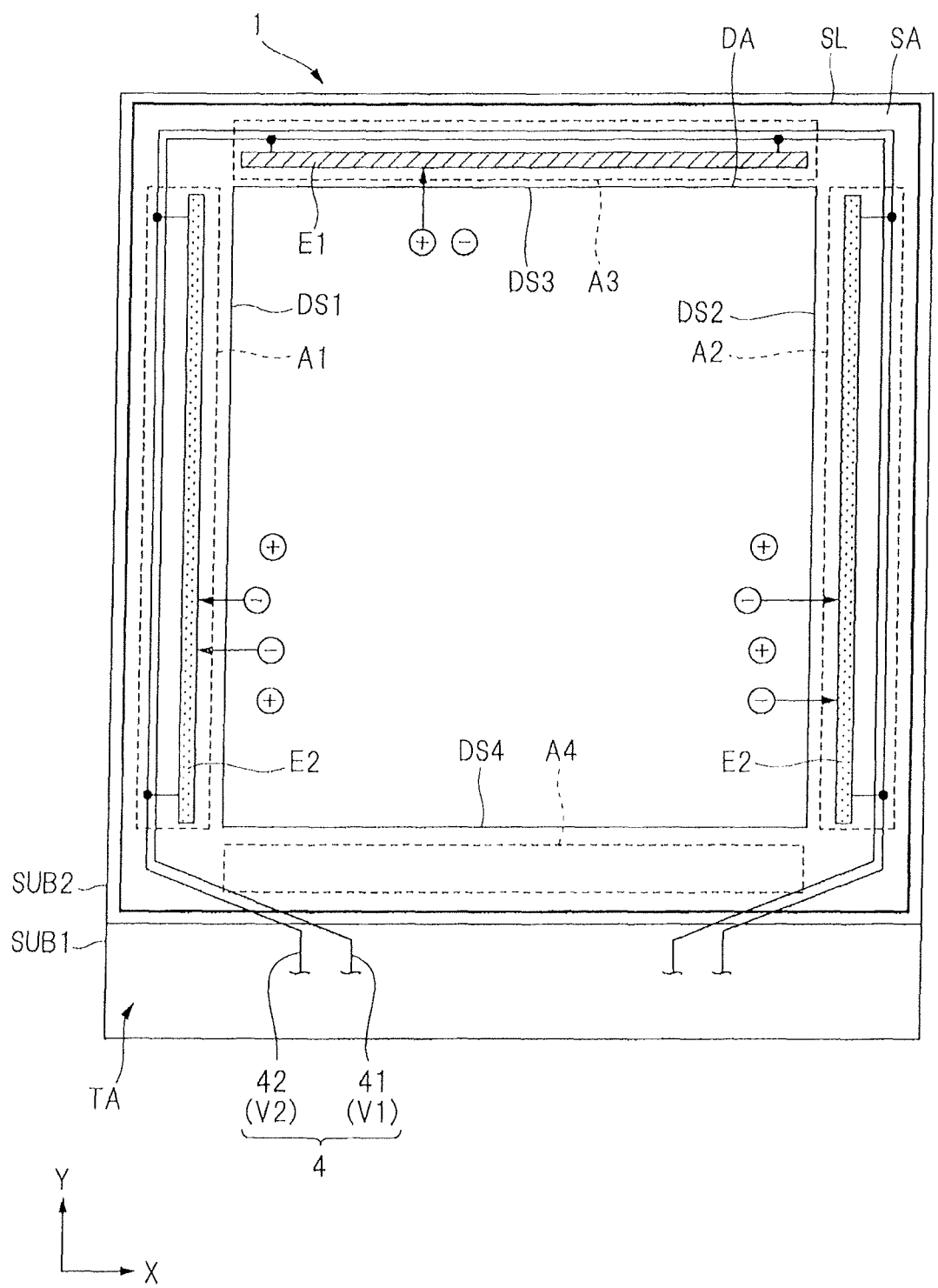
FIG. 3 is a plan view schematically illustrating an example of a configuration of an electrode in the display device according to the first embodiment.

FIG. 3 is a plan view schematically illustrating an example of a configuration of an electrode in the display device 1 according to the present first embodiment. Here, a part of elements illustrated in FIG. 1 is omitted. The display region DA includes a first side DS1, a second side DS2 opposite to the first side DS1, a third side DS3, and a fourth side DS4 opposite to the third side DS3. The fourth side DS4 is a side closer to an output region TA.

The peripheral region SA includes a first region A1 between the first side DS1 and the sealing material SL, a second region A2 between the second side DS2 and the sealing material SL, a third region A3 between the third side DS3 and the sealing material SL, and a fourth region A4 between the fourth side DS4 and the sealing material SL. The regions A1, A2, and A4 are regions where the first scanning driver GD1, the second scanning driver GD2, and the video driver SD illustrated in FIG. 1 are provided, respectively. The first region A1 and the second region A2 sandwich the display region DA. The third region A3 and the fourth region A4 are disposed in a direction (Y direction) different from a direction (X direction) in which the first region A1 and the second region A2 are disposed, and sandwich the display region DA.

The display device 1 includes a first electrode E1 and a second electrode E2. The first electrode E1 is provided in any region, such as a region of a first group in this case, among the first region A1, the second region A2, the third region A3, and the fourth region A4 of the peripheral region SA. The second electrode E2 is provided in a region different from the region where the first electrode E1 is formed, such as a region of a second group different from the first group in this case, among the first region A1, the second region A2, the third region A3, and the fourth region A4 of the peripheral region SA. In the example of FIG. 3, the first electrode E1 is provided in the third region A3 to be the first group, and the second electrode E2 is provided in the first region A1 and the second region A2 to be the second group. A space of the fourth region A4 is small since various wirings and circuits including the video driver SD are provided therein. Therefore, in the example of FIG. 3, the first electrode E1 and the second electrode E2 are not provided in the fourth region A4.

The voltage supply wiring 4 (each of the power supply lines 41 and 42) provided in the peripheral region SA surrounds the display region DA, coincides with an extending direction of the video signal lines S (Y direction) in the first region A1 and the second region A2, and coincides with an extending direction of the scanning signal lines G (X direction) in the third region A3. Accordingly, the second electrode E2 which is provided in the first region A1 and the second region A2 extends in the Y direction while the first electrode E1 which is provided in the third region A3 extends in the X direction.

The first electrode E1 is connected to the first power supply line 41. The second electrode E2 is connected to the second power supply line 42. That is, the first voltage V1 is supplied to the first electrode E1, and the second voltage V2 is supplied to the second electrode E2. In the present first embodiment, the first voltage V1 is a voltage of a negative polarity, and the second voltage V2 is a voltage of a positive polarity. Thus, the polarity of the first voltage V1 that is supplied to the first electrode E1 is different from the polarity of the second voltage V2 that is supplied to the second electrode E2.

The liquid crystal layer LC contains a positive ion (+) and a negative ion (−). The positive ion is attracted to the first electrode E1 to which the first voltage V1 of the negative polarity is applied. The negative ion is attracted to the second electrode E2 to which the second voltage V2 of the positive polarity is applied. In this manner, the positive ion and the negative ion are trapped (restricted) by the first electrode E1 and the second electrode E2 that are separated from each other in the peripheral region SA, so that the concentration of these ions at a certain position can be prevented.

<Cross-Sectional Structure of Display Device>

Figure 4:
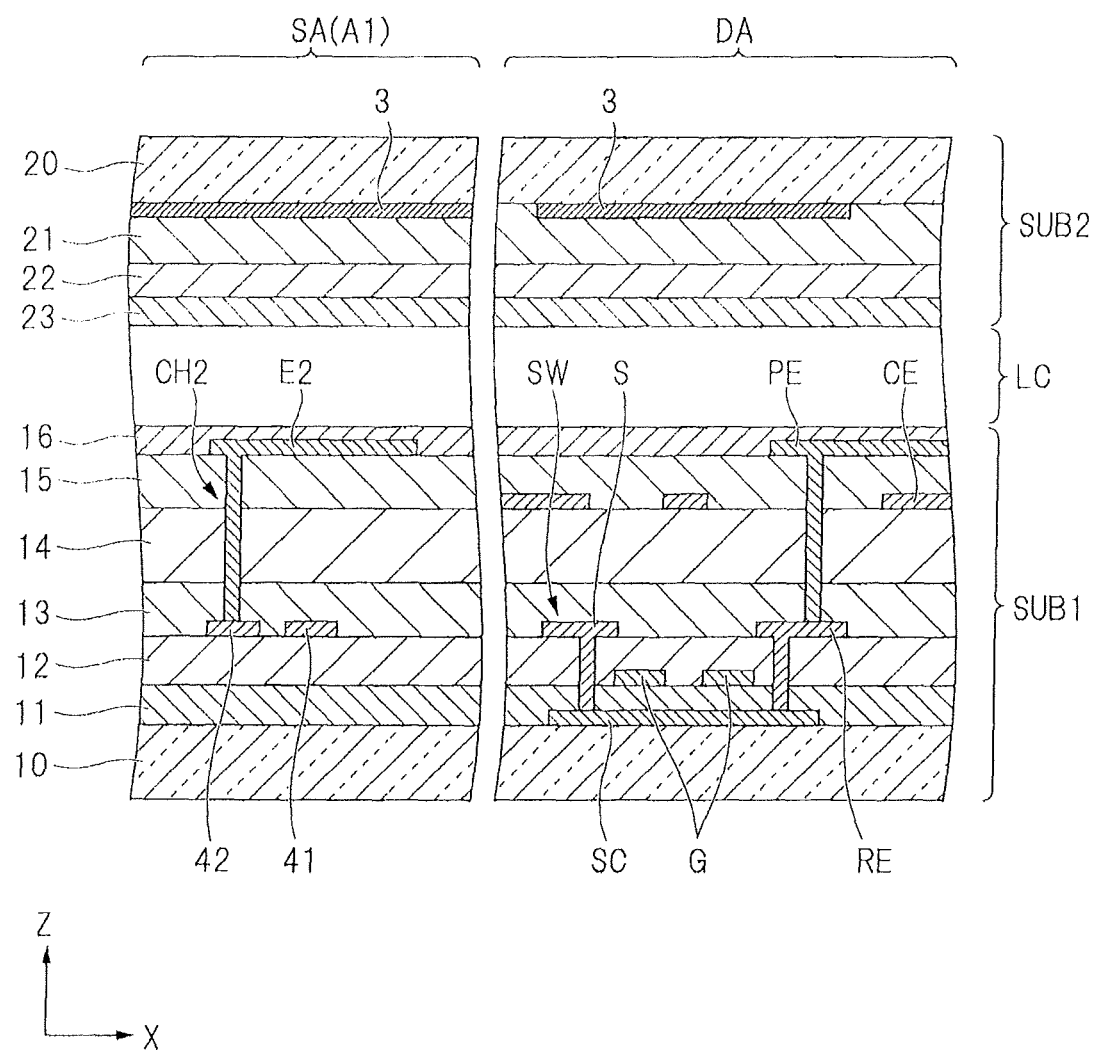
FIG. 4 is a cross-sectional view schematically illustrating an example of a cross-sectional structure (a first region of a peripheral region and a display region) of the display device according to the first embodiment.
Figure 5:
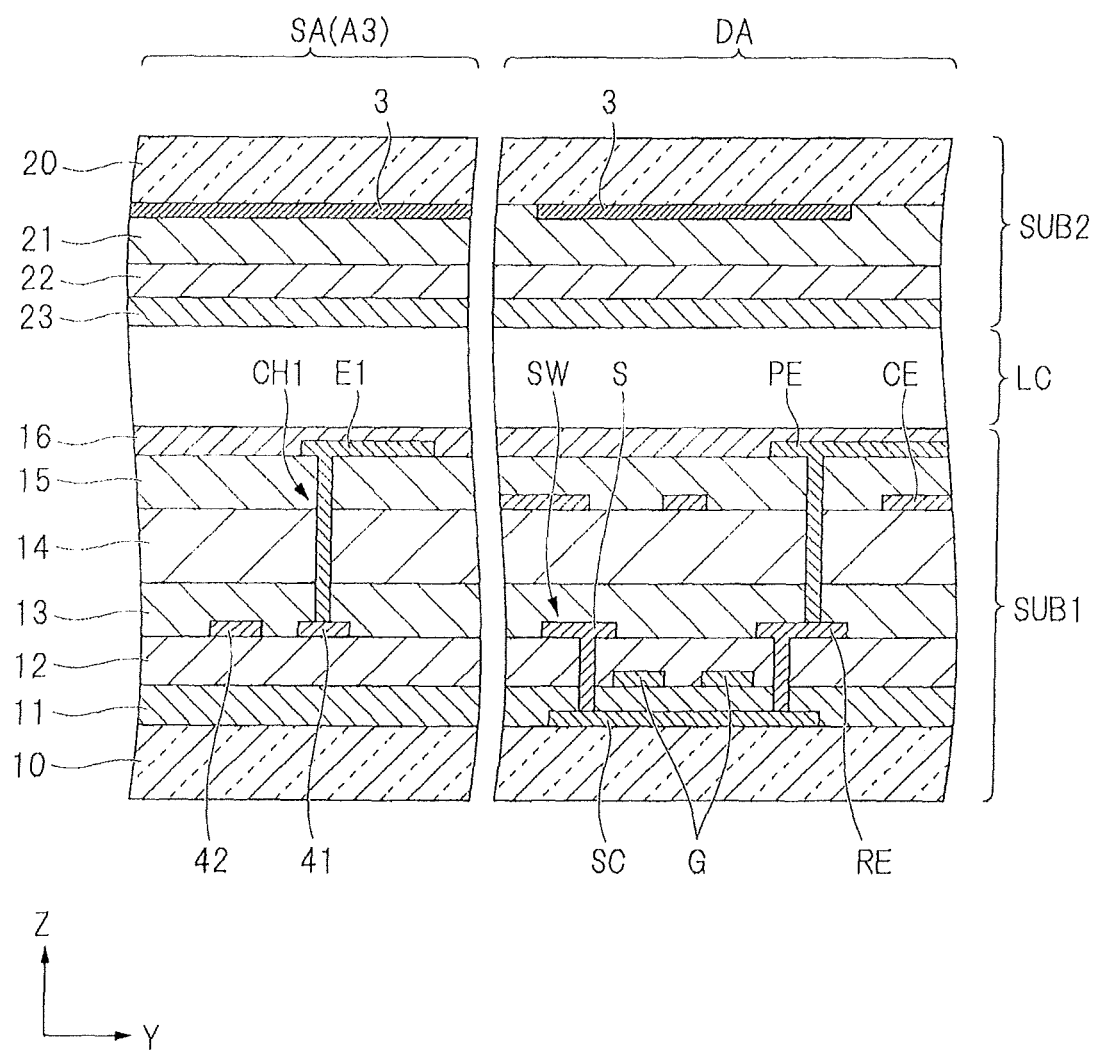
FIG. 5 is a cross-sectional view schematically illustrating an example of a cross-sectional structure (a third region of the peripheral region and the display region) of the display device according to the first embodiment.

Next, a cross-sectional structure of the display device 1 according to the present first embodiment is described with reference to FIGS. 4 and 5. FIGS. 4 and 5 are cross-sectional views schematically illustrating an example of the cross-sectional structure of the display device 1, FIG. 4 illustrates the first region A1 of the peripheral region SA and the display region DA, and FIG. 5 illustrates the third region A3 of the peripheral region SA and the display region DA. The second region A2 of the peripheral region SA is the same as that in FIG. 4 except that right and left sides of FIG. 4 are inverted, and therefore, illustration thereof is omitted.

As illustrated in FIGS. 4 and 5, the first substrate SUB1 includes a first insulating substrate 10, a first insulating layer 11, a second insulating layer 12, a third insulating layer 13, a fourth insulating layer 14, a fifth insulating layer 15, and a first orientation film 16. Further, the first substrate SUB1 is provided with the scanning signal line G, the video signal line S, the switching element SW, the pixel electrode PE, and the common electrode CE in the display region DA and is provided with the first power supply line 41, the second power supply line 42, the first electrode E1, and the second electrode E2 in the peripheral region SA. The first electrode E1 is provided in the third region A3 of the peripheral region SA as illustrated in FIG. 5. The second electrode E2 is provided each in the first region A1 and the second region A2 of the peripheral region SA as illustrated in FIG. 4.

A semiconductor layer SC of each of the switching elements SW is formed on a surface of the first insulating substrate 10, the surface being closer to a second substrate SUB2, and this surface of the first insulating substrate 10 and the semiconductor layer SC are covered with the first insulating layer 11. On the first insulating layer 11, the scanning signal line G is formed. The first insulating layer 11 and the scanning signal line G are covered with the second insulating layer 12. On the second insulating layer 12, a relay electrode RE and the video signal line S of the switching element SW as well as each of the power supply lines 41 and 42 are formed. The video signal line S and the relay electrode RE are in contact with the semiconductor layer SC through a contact hole provided in each of the insulating layers 11 and 12.

The second insulating layer 12, the relay electrode RE, the video signal line S, and each of the power supply lines 41 and 42 are covered with the third insulating layer 13. The third insulating layer 13 is covered with the fourth insulating layer 14 made of an organic material. On the fourth insulating layer 14, the common electrode CE is formed. The fourth insulating layer 14 and the common electrode CE are covered with the fifth insulating layer 15. On the fifth insulating layer 15, the pixel electrode PE, the first electrode E1, and the second electrode E2 are formed. The pixel electrode PE is in contact with the relay electrode RE through a contact hole provided in each of the insulating layers 13 to 15.

In the third region A3 of the peripheral region SA, the first electrode E1 is connected to the first power supply line 41 through a first contact hole CH1 provided in each of the insulating layers 13 to 15. In the first region A1 and the second region A2 of the peripheral region SA, the second electrode E2 is connected to the second power supply line 42 through a second contact hole CH2 provided in each of the insulating layers 13 to 15. The fifth insulating layer 15, the pixel electrode PE, and each of the electrodes E1 and E2 are covered with the first orientation film 16. The first orientation film 16 is in contact with the liquid crystal layer LC.

In this manner, each of the electrodes E1 and E2 provided in each of the regions A1 to A3 of the peripheral region SA is disposed at a position closer to the liquid crystal layer LC than each of the power supply lines 41 and 42. Accordingly, an electric field of each of the electrodes E1 and E2 easily acts on the liquid crystal layer LC and can favorably trap the ions in the liquid crystal layer LC. Particularly, in the example of FIGS. 4 and 5, each of the electrodes E1 and E2 is disposed at a position closer to the liquid crystal layer LC than the fourth insulating layer 14 which is the thickest among the insulating layers 11 to 15. Therefore, ion-trapping capability of each of the electrodes E1 and E2 is further improved.

The second substrate SUB2 includes a second insulating substrate 20, a color filter layer 21, an overcoat layer 22, a second orientation film 23, and the light shielding layer 3 described above. The light shielding layer 3 is formed on a surface of the second insulating substrate 20, the surface being closer to the first substrate SUB1, and this surface of the second insulating substrate 20 and the light shielding layer 3 are covered with the color filter layer 21. The color filter layer 21 is covered with the overcoat layer 22. The overcoat layer 22 is covered with the second orientation film 23. The second orientation film 23 is in contact with the liquid crystal layer LC.

The light shielding layer 3 is provided in not only the peripheral region SA but also the display region DA. The light shielding layer 3 provided in the display region DA faces the switching element SW, the scanning signal line G, and the video signal line S. Generally, the light shielding layer 3 provided in the display region DA has a matrix form.

Each of the pixel electrode PE, the common electrode CE, and the electrodes E1 and E2 is made of, for example, a transparent conductive material such as indium tin oxide (ITO). Each of the scanning signal line G, the video signal line S, the relay electrode RE, and the power supply lines 41 and 42 is made of, for example, a metallic material.

In the example of FIGS. 4 and 5, each of the power supply lines 41 and 42 and the video signal line S are formed in the same layer as one another. However, each of the power supply lines 41 and 42 may also be formed in a layer different from that of the video signal line S, such as the same layer as that of the scanning signal line G. Furthermore, each of the power supply lines 41 and 42 may also be formed in different layers from each other. Still furthermore, each of the power supply lines 41 and 42 may also be formed by changing the layers.

In the example of FIGS. 4 and 5, each of the electrodes E1 and E2 is formed in the same layer as that of the pixel electrode PE and is covered with the first orientation film 16. However, each of the electrodes E1 and E2 may also not be covered with the first orientation film 16 but exposed from the liquid crystal layer LC. Furthermore, each of the electrodes E1 and E2 may also be formed in a layer different from that of the pixel electrode PE, such as the same layer as that of the common electrode CE. Still furthermore, each of the electrodes E1 and E2 may also be formed in different layers from each other. Still furthermore, each of the electrodes E1 and E2 may also be formed by changing the layers.

Each of the electrodes E1 and E2 may also be made of a metallic material. For example, each of the electrodes E1 and E2 made of the metallic material can be formed on the fourth insulating layer 14. In a process of forming each of the electrodes E1 and E2 as described above, metal wirings made of the same metallic material as each other may be formed on the common electrode CE so as to face the video signal line S. By providing this metal wiring, a resistance of the common electrode CE can be reduced.

<Layout of Electrode and Power Supply Line>

Figure 6:
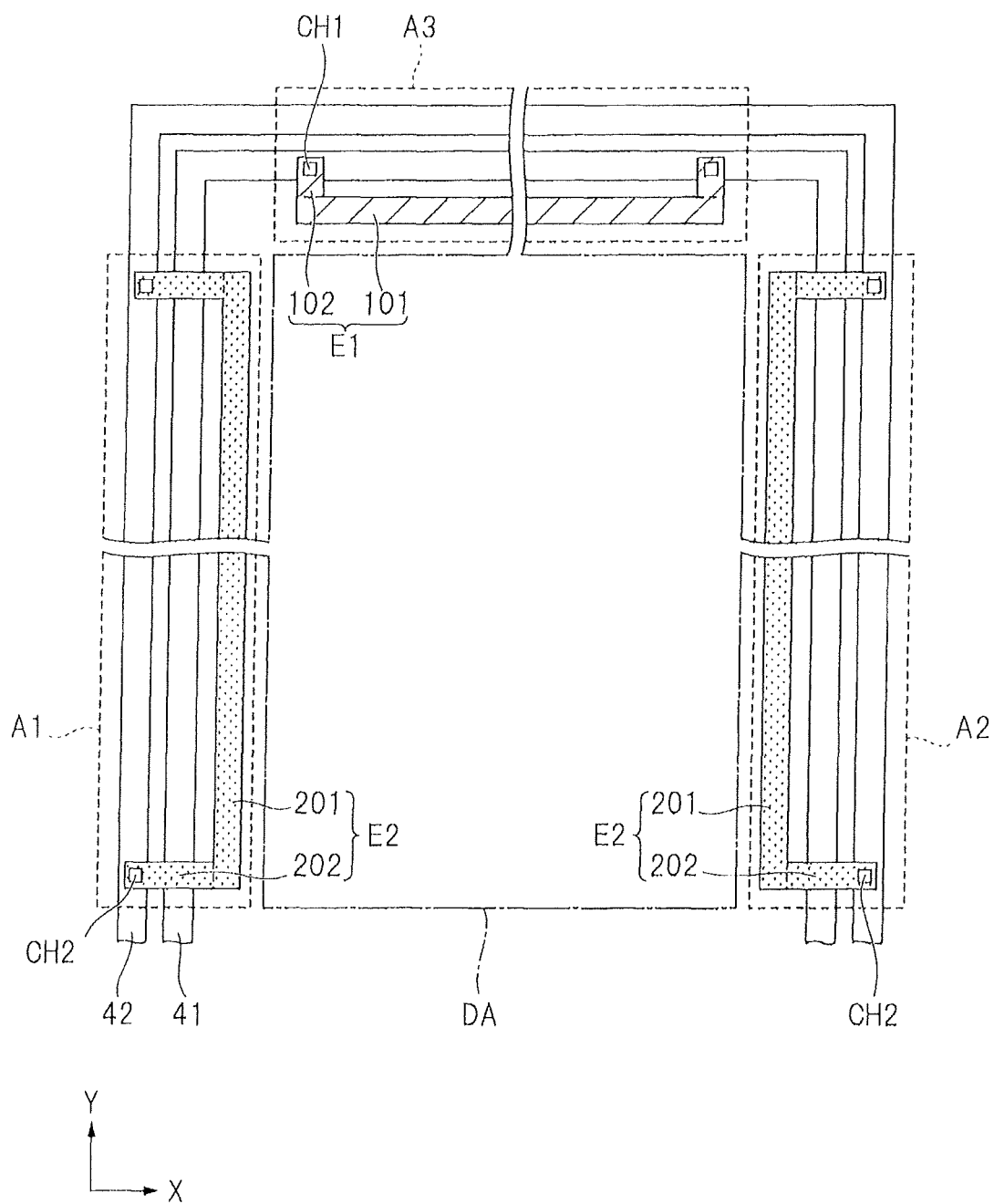
FIG. 6 is a plan view schematically illustrating an example of a planar arrangement and a shape of each electrode and each power supply line in the display device according to the first embodiment.

Subsequently, in the display device 1 according to the present first embodiment, a planar layout and a shape of each of the electrodes E1 and E2 and each of the power supply lines 41 and 42 are described with reference to FIG. 6. FIG. 6 is a plan view schematically illustrating an example of the planar layout and the shape of each of the electrodes E1 and E2 and each of the power supply lines 41 and 42. FIG. 6 illustrates the display region DA and each of the electrodes E1 and E2 and each of the power supply lines 41 and 42 disposed in the respective regions A1 to A3.

In the example of FIG. 6, the first electrode E1 is disposed in the third region A3, and the first electrode E1 includes a first main portion 101 and a first connecting portion 102. The second electrode E2 is disposed each in the first region A1 and the second region A2, and the second electrode E2 includes a second main portion 201 and a second connecting portion 202. The first main portion 101 and the first connecting portion 102 are connected to each other so that the first connecting portion 102 is connected at both end portions of the first main portion 101 in L-shape connection. The first main portion 101 and the first connecting portion 102 may be connected to each other so that the first connecting portion 102 is connected at only one of the end portions of the first main portion 101 in L-shape connection. Further, the first main portion 101 and the first connecting portion 102 may also be connected to each other in another aspect such as T-shape connection. Similarly, the second main portion 201 and the second connecting portion 202 are connected to each other so that the second connecting portion 202 is connected at both end portions of the second main portion 201 in L-shape connection. However, the second connecting portion 202 may also be connected at only one of the end portions of the second main portion 201 in L-shape connection or in another aspect such as T-shape connection.

The first main portion 101 is disposed between the first power supply line 41 and the display region DA and has a shape that elongates in the X direction. The first connecting portion 102 extends in the Y direction from the first main portion 101 to a position overlapping the first power supply line 41 and is connected to the first power supply line 41 through the first contact hole CH1. The second main portion 201 is disposed between the first power supply line 41 and the display region DA and has a shape that elongates in the Y direction. The second connecting portion 202 extends in the X direction from the second main portion 201 to a position overlapping the second power supply line 42 and is connected to the second power supply line 42 through the second contact hole CH2.

In the example of FIG. 6, the first power supply line 41 is disposed between the second power supply line 42 and the display region DA in a plan view. Besides, each of the electrodes E1 and E2 is disposed between the first power supply line 41 and the display region DA in a plan view. In this manner, each of the electrodes E1 and E2 is disposed at a position closer to the display region DA than each of the power supply lines 41 and 42. In this case, the ions in the liquid crystal layer LC in the display region DA are attracted to each of the electrodes E1 and E2 without being affected by an electric field generated by each of the power supply lines 41 and 42. Therefore, the trapping capability of each of the electrodes E1 and E2 can be increased.

In addition to the configuration illustrated in the example of FIG. 6, each of the electrodes E1 and E2 can be modified in various aspects. For example, in a plan view, the first main portion 101 of the first electrode E1 and the second main portion 201 of the second electrode E2 may also be disposed between the power supply lines 41 and 42. Also, the first electrode E1 may be disposed immediately above the first power supply line 41, and the second electrode E2 may be disposed immediately above the second power supply line 42. In these examples, a width in the Y direction of the first electrode E1 and a width in the X direction of the second electrode E2 can be reduced, and therefore, such electrodes E1 and E2 are advantageous for a case without a large enough layout space.

In the display device according to the present first embodiment described above, the first electrode E1 is provided in the third region A3, and the second electrode E2 is disposed each in the first region A1 and the second region A2. In such a configuration, the positive ions in the liquid crystal layer LC can be attracted to the first electrode E1 of the negative polarity without being interrupted by the second electrode E2 of the positive polarity. Similarly, the negative ions in the liquid crystal layer LC can be attracted to the second electrode E2 of the positive polarity without being interrupted by the first electrode E1 of the negative polarity.

In this manner, by separately trapping both of the positive ions and the negative ions by the respective electrodes E1 and E2 disposed in the peripheral region SA, it is difficult to cause an ion-concentrated region. Therefore, the black unevenness and others caused by the concentrated ions can be suppressed, and the display quality can be improved.

Further, in the present first embodiment, as the voltage supply wiring 4 that supplies a voltage to each of the electrodes E1 and E2, the first power supply line 41 and the second power supply line 42 that supply a voltage to each of the scanning drivers GD1 and GD2 are used. Thus, it is not necessary to separately provide a wiring for supplying the voltage to each of the electrodes E1 and E2. Accordingly, space-saving is achieved in the peripheral region SA.

Modification Example

Figure 7:
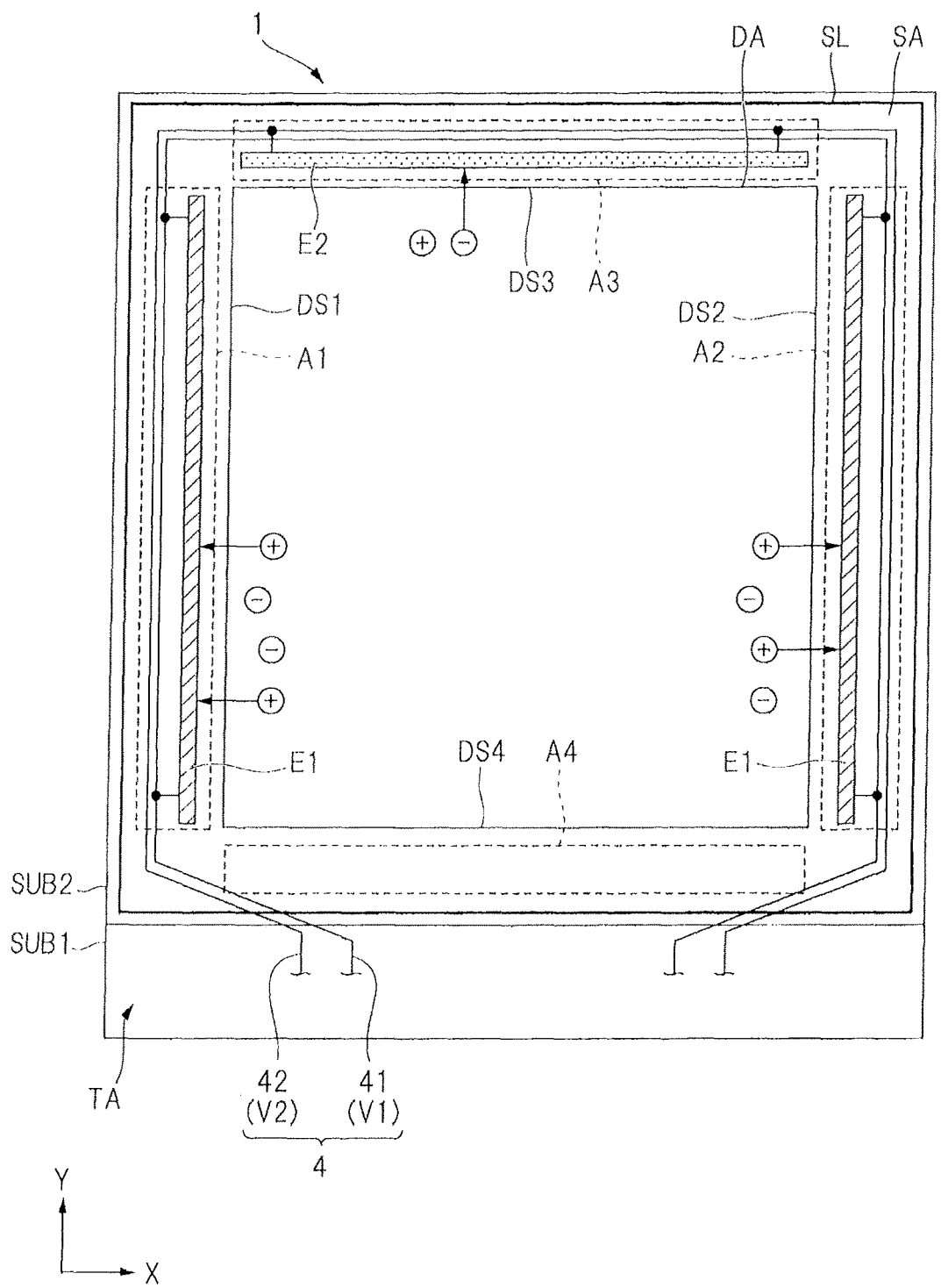
FIG. 7 is a plan view schematically illustrating a modification example of the configuration of the electrode in the display device according to the first embodiment.

FIG. 7 is a plan view schematically illustrating a modification example of the configuration of the electrode in the display device 1 according to the present first embodiment. In the modification example illustrated in FIG. 7, positions of the first electrode E1 and the second electrode E2 provided in the peripheral region SA are different from those of the first electrode E1 and the second electrode E2 illustrated in FIG. 3. Here, differences are mainly described.

In the example of FIG. 7, the first electrode E1 is provided in the first region A1 and the second region A2 in the first group, and the second electrode E2 is provided in the third region A3 in the second group. The first electrode E1 which is provided in each of the first region A1 and the second region A2 extends in the Y direction while the second electrode E2 which is provided in the third region A3 extends in the X direction.

The first electrode E1 is connected to the first power supply line 41. The second electrode E2 is connected to the second power supply line 42. That is, the first voltage V1 of the negative polarity is supplied to the first electrode E1, and the second voltage V2 of the positive polarity is supplied to the second electrode E2.

Thus, as similar to the first embodiment, also in the modification example illustrated in FIG. 7, it is difficult to cause the ion-concentrated region by separately trapping both of the positive ions and the negative ions by each of the electrodes E1 and E2 disposed in the peripheral region SA. Therefore, the black unevenness and others caused by the concentrated ions can be suppressed, and the display quality can be improved.

Another Modification Example

The following modification example may be applied to the display device 1 according to the present first embodiment.

The above-described first embodiment has described the example in which each of the electrodes E1 and E2 is not disposed in the fourth region A4. However, the first electrode E1 or the second electrode E2 may be disposed in the fourth region A4. In the fourth region A4 in this case, for example, it is desired that the first electrode E1 as similar to that in the third region A3 in the above-described example of FIG. 3 is disposed, and that the second electrode E2 as similar to that in the third region A3 in the above-described example of FIG. 7 is disposed.

Further, the shape and layout aspects of the electrodes E1 and E2 may be different in each of the regions A1 to A4. In this case, for example, a width in the X direction of the electrode in the first region A1 or the second region A2 may be different from a width in the Y direction of the electrode in the third region A3 or the fourth region A4.

As a specific example, the width in the X direction of the electrode may be decreased in each of the regions A1 and A2 having no large enough space to dispose each of the scanning drivers GD1 and GD2, and the width in the Y direction of the electrode may be increased in the third region A3 having the large enough space.

When each of the electrodes E1 and E2 is disposed also in the fourth region A4, the width in the Y direction of the electrode may be decreased as similar to those in the regions A1 and A2 in consideration of the layout of the video driver SD in the fourth region A4. Alternatively, if the large enough space can be secured in the fourth region A4, the width in the Y direction of the electrode may also be increased in the fourth region A4 as similar to that in the third region A3.

In addition, in consideration of the space and the layer structure of each of the regions A1 to A4, various aspects can be employed to the shape and the layout aspects of each of the electrodes E1 and E2 disposed in each of the regions A1 to A4. Further, in one region, each of the electrodes E1 and E2 may be disposed in different shapes and aspects. Further, since a liquid crystal display device generally tends to generate the positive ions as impurities, the number of the first electrodes E1 may be set to be larger than the number of the second electrodes E2.

In addition, the first embodiment can be modified in various aspects. For example, the present first embodiment can be combined with second to fourth embodiments described below. In this case, a part of the configuration of the present first embodiment can be replaced with another configuration of the second to fourth embodiments, another configuration of the second to fourth embodiments can be added to the configuration of the present first embodiment, or a part of the configuration of the present first embodiment can be removed.

Second Embodiment

A display device according to the present second embodiment is described with reference to FIGS. 8 and 9. In the present second embodiment, differences from the above-described first embodiment are mainly described.

<Configuration of Electrode>

Figure 8:
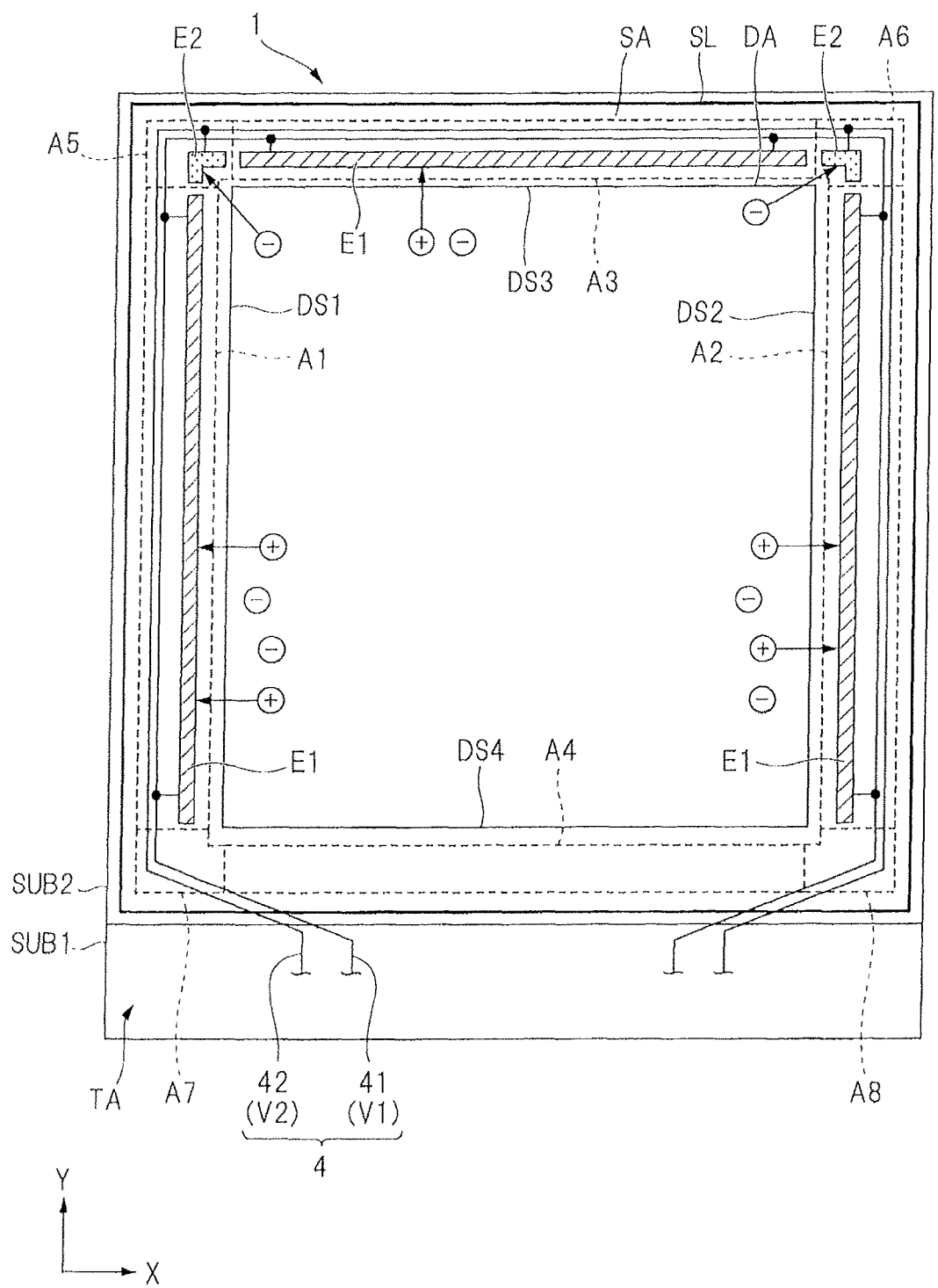
FIG. 8 is a plan view schematically illustrating an example of a configuration of an electrode in a display device according to a second embodiment.

FIG. 8 is a plan view schematically illustrating an example of a configuration of an electrode in a display device 1 according to the present second embodiment.

In the display device 1 according to the present second embodiment, the peripheral region SA includes the first region A1, the second region A2, the third region A3, and the fourth region A4 as similar to the above-described first embodiment. In the present second embodiment, the peripheral region SA further includes a fifth region A5, a sixth region A6, a seventh region A7, and an eighth region A8. The fifth region A5 is a corner region between the first region A1 and the third region A3. The sixth region A6 is a corner region between the second region A2 and the third region A3. The seventh region A7 is a corner region between the first region A1 and the fourth region A4. The eighth region A8 is a corner region between the second region A2 and the fourth region A4. That is, in the example of FIG. 8, in the peripheral region SA, the fifth region A5 is an upper left corner portion, the sixth region A6 is an upper right corner portion, the seventh region A7 is a lower left corner portion, and the eighth region A8 is a lower right corner portion.

In the display device 1 according to the present second embodiment, the first electrode E1 is provided in a region of a first group among the first to eighth regions A1 to A8 of the peripheral region SA. The second electrode E2 is provided in a region of a second group which is different from the first group among the first to eighth regions A1 to A8 of the peripheral region SA. In the example of FIG. 8, the first electrode E1 is provided in each of the first to third regions A1 to A3 of the first group, and the second electrode E2 is provided in each of the fifth region A5 and the sixth region A6 of the second group.

Since the fourth region A4, the seventh region A7, and the eighth region A8 are provided with various wirings and circuits including the video driver SD, there is less space in them. Accordingly, in the example of FIG. 8, the first electrode E1 and the second electrode E2 are not provided in the fourth region A4, the seventh region A7, and the eighth region A8. If the space can be secured in the fourth region A4, the seventh region A7, and the eighth region A8, note that the first electrode E1 or the second electrode E2 may be disposed in the fourth region A4, the seventh region A7, and the eighth region A8.

The voltage supply wiring 4 (each of the power supply lines 41 and 42) provided in the peripheral region SA surrounds the display region DA, coincides with an extending direction of the video signal lines S (Y direction) in the first region A1 and the second region A2, and coincides with an extending direction of the scanning signal lines G (X direction) in the third region A3. Further, in the fifth region A5 and the sixth region A6, the voltage supply wiring 4 is formed into an L-shape extending in the Y direction and the X direction. Accordingly, the first electrode E1 provided in each of the first region A1 and the second region A2 extends in the Y direction, and the first electrode E1 provided in the third region A3 extends in the X direction. Further, the second electrode E2 provided in each of the fifth region A5 and the sixth region A6 is formed into an L-shape extending in the Y direction and the X direction. That is, a shape of the first electrode E1 provided in each of the first to third regions A1 to A3 is different from a shape of the second electrode E2 provided in each of the fifth and sixth regions A5 and A6.

The first electrode E1 is connected to the first power supply line 41. The second electrode E2 is connected to the second power supply line 42. That is, the first voltage V1 of the negative polarity is supplied to the first electrode E1, and the second voltage V2 of the positive polarity is supplied to the second electrode E2.

Therefore, also in the display device 1 according to the present second embodiment, as similar to the above-described first embodiment, the positive ions in the liquid crystal layer LC can be attracted to the first electrode E1 to which the first voltage of the negative polarity V1 is applied. Similarly, the negative ions in the liquid crystal layer LC can be attracted to the second electrode E2 to which the second voltage V2 of the positive polarity is applied. In this manner, by separately trapping both of the positive ions and the negative ions by the electrodes E1 and E2 disposed in the peripheral region SA, it is difficult to cause an ion-concentrated region. Therefore, the black unevenness and others caused by the concentrated ions can be suppressed, and the display quality can be improved. Particularly, in the present second embodiment, by trapping the ions also in the corner regions of the peripheral region SA, the trapping capability can be further improved, so that the display quality can be further improved.

Modification Example

Figure 9:
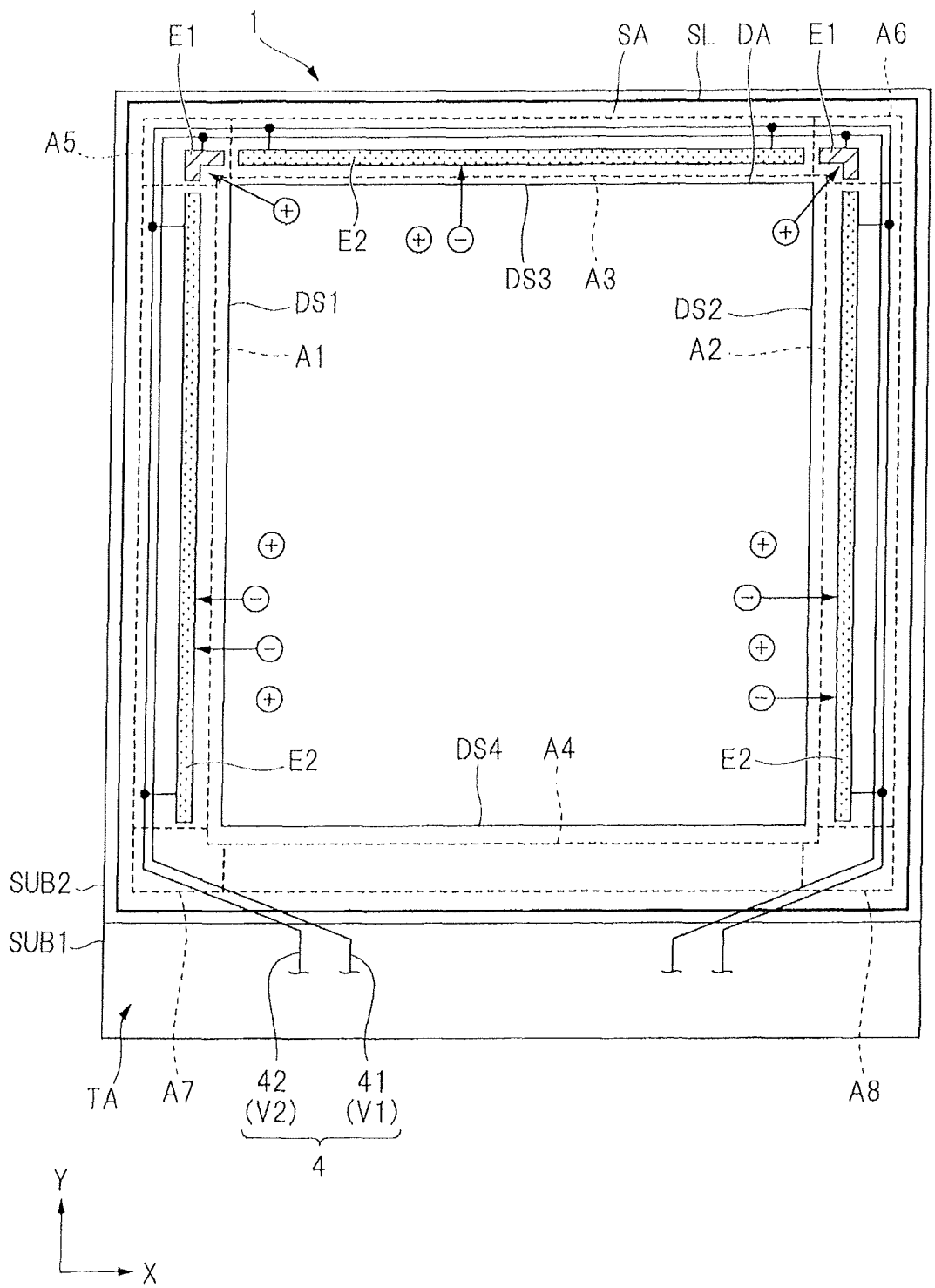
FIG. 9 is a plan view schematically illustrating a modification example of the configuration of the electrode in the display device according to the second embodiment.

FIG. 9 a plan view schematically illustrating a modification example of a configuration of an electrode in the display device 1 according to the present second embodiment. In the modification example illustrated in FIG. 9, positions of the first electrode E1 and the second electrode E2 provided in the peripheral region SA are different from the positions of the first electrode E1 and the second electrode E2 illustrated in FIG. 8. Here, differences are mainly described.

In the example of FIG. 9, the first electrode E1 is provided in the fifth region A5 and the sixth region A6 of the first group, and the second electrode E2 is provided in the first to third regions A1 to A3 of the second group. The first electrode E1 which is provided in each of the fifth region A5 and the sixth region A6 is formed into an L-shape extending in the Y direction and the X direction, the second electrode E2 which is provided in each of the first region A1 and the second region A2 extends in the Y direction, and the second electrode E2 provided in the third region A3 extends in the X direction.

The first electrode E1 is connected to the first power supply line 41. The second electrode E2 is connected to the second power supply line 42. That is, the first voltage V1 of the negative polarity is supplied to the first electrode E1, and the second voltage V2 of the positive polarity is supplied to the second electrode E2.

Thus, also in the modification example illustrated in FIG. 9, as similar to the present second embodiment, it is difficult to cause the ion-concentrated region by separately trapping both of the positive ions and the negative ions by the electrodes E1 and E2 disposed in the peripheral region SA. Therefore, the black unevenness and others caused by the concentrated ions can be suppressed, and the display quality can be improved.

Third Embodiment

A display device according to the present third embodiment is described with reference to FIGS. 10 and 11. In the present third embodiment, differences from the first and second embodiments described above are mainly described.

<Configuration of Electrode>

Figure 10:
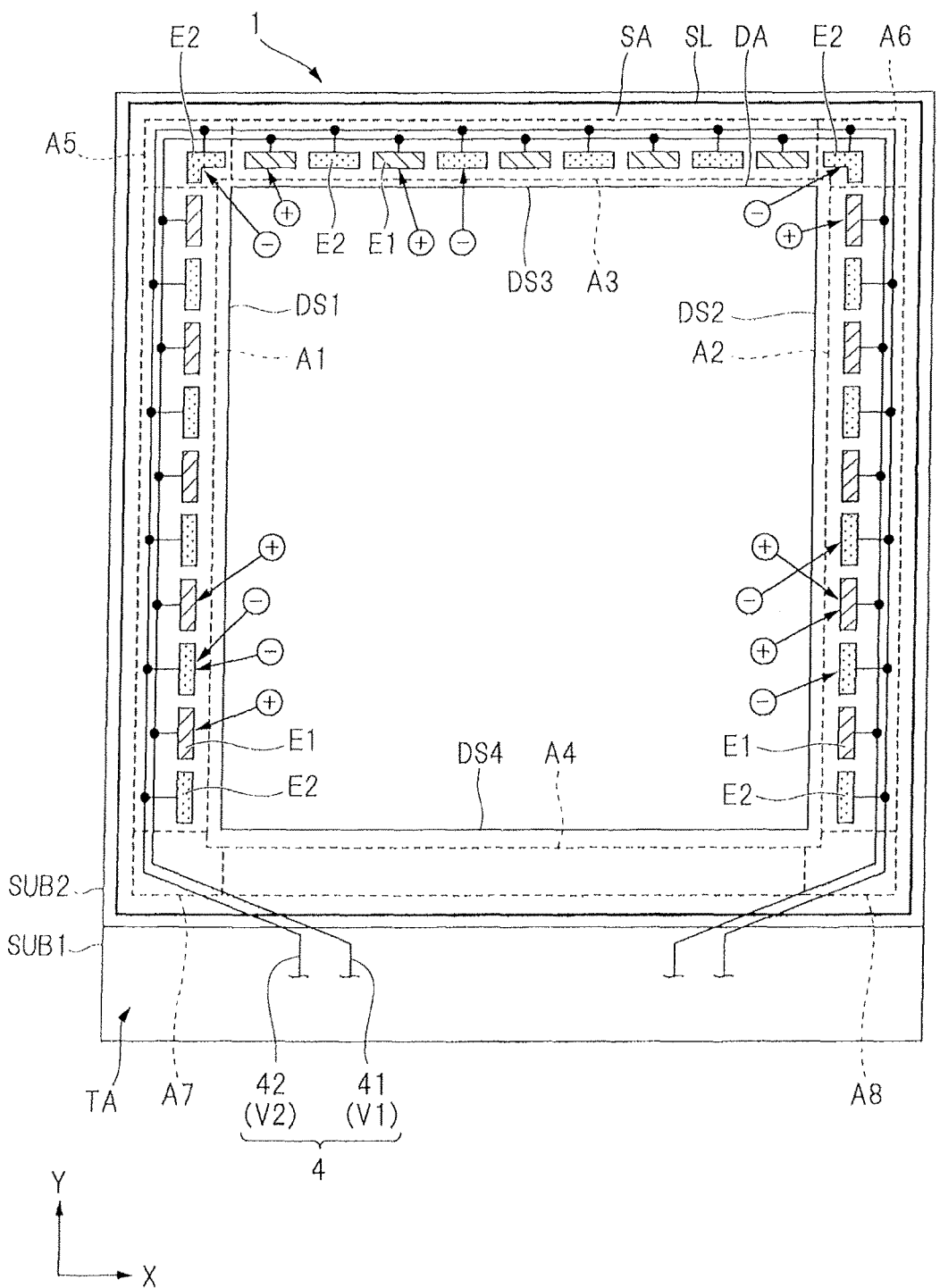
FIG. 10 is a plan view schematically illustrating an example of a configuration of an electrode in the display device according to a third embodiment.

FIG. 10 is a plan view schematically illustrating an example of a configuration of an electrode in a display device 1 according to the present third embodiment. FIG. 11 is a plan view schematically illustrating an example of a layout and a shape of each electrode and each power supply line.

In the display device 1 according to the present third embodiment, as similar to the above-described second embodiment, the peripheral region SA includes the first region A1, the second region A2, the third region A3, the fourth region A4, the fifth region A5, the sixth region A6, the seventh region A7, and the eighth region A8.

The display device 1 according to the present third embodiment includes a plurality of first electrodes E1 and a plurality of second electrodes E2. A first number of the first electrodes E1 and the second electrodes E2 among the plurality of them are provided in a region of a first group among the first to eighth regions. A second number of the first electrodes or the second electrodes among the plurality of them, the second number being different from the first number, are provided in region of a second group among the first to eighth regions, the second group being different from the first group. In the example of FIG. 10, the first number of electrodes E1 and second electrodes E2, the first number being a plural number, are alternately disposed in each of the first to third regions A1 to A3 of the first group, and the second number of electrode E2, the second number being one, is provided in each of the fifth region A5 and the sixth region A6 of the second group. Note that not only the second electrode E2 but also the first electrode E1 may be provided in the fifth region A5 and the sixth region A6. That is, the plurality of first electrodes E1 and second electrodes E2 are provided in each region of the first to third regions A1 to A3, and either the first electrode E1 or the second electrode E2 is provided in each region of the fifth region A5 and the sixth region A6.

Since various wirings and circuits including the video driver SD are provided in the fourth region A4, the seventh region A7, and the eighth region A8, the spaces in the regions are small. Accordingly, in the example of FIG. 10, the first electrode E1 and the second electrode E2 are not provided in the fourth region A4, the seventh region A7, and the eighth region A8. If the spaces can be secured in the fourth region A4, the seventh region A7, and the eighth region A8, note that the first electrode E1 and the second electrode E2 may be alternately disposed also in the fourth region A4 while the first electrode E1 or the second electrode E2 may be provided also in the seventh region A7 and the eighth region A8.

The voltage supply wiring 4 (each of the power supply lines 41 and 42) provided in the peripheral region SA surrounds the display region DA, coincides with an extending direction of the video signal lines S (Y direction) in the first region A1 and the second region A2, and coincides with an extending direction of the scanning signal lines G (X direction) in the third region A3. Further, in the fifth region A5 and the sixth region A6, the voltage supply wiring 4 is formed into an L-shape extending in the Y direction and the X direction. Accordingly, the plurality of first electrodes E1 and second electrodes E2 provided in the first region A1 and the second region A2 extend in the Y direction and are alternately disposed in the Y direction, and the plurality of first electrodes E1 and second electrodes E2 provided in the third region A3 extend in the X direction and are alternately disposed in the X direction. Further, the second electrode E2 provided in each of the fifth region A5 and the sixth region A6 is formed into an L-shape extending in the Y direction and the X direction. That is, each shape of the first electrode E1 and the second electrode E2 provided in each of the first to third regions A1 to A3 is different from a shape of the second electrode E2 provided in each of the fifth and sixth regions A5 and A6.

Each of the plurality of first electrodes E1 is connected to the first power supply line 41. Each of the plurality of second electrodes E2 is connected to the second power supply line 42. That is, the first voltage V1 of the negative polarity is supplied to the plurality of first electrodes E1, and the second voltage V2 of the positive polarity is supplied to the plurality of second electrodes E2.

Figure 11:
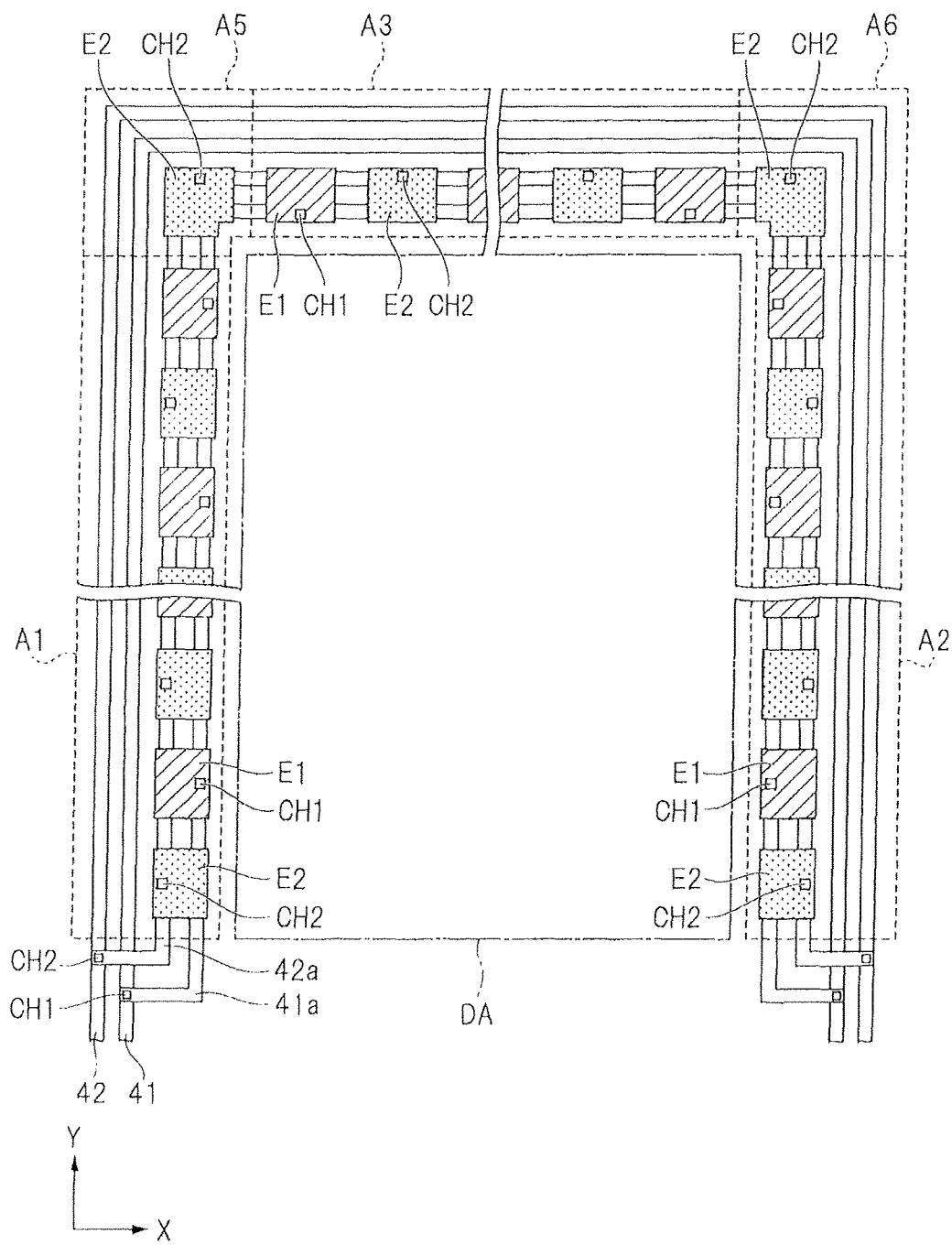
FIG. 11 is a plan view schematically illustrating an example of an arrangement and a shape of each electrode and each power supply line in the display device according to the third embodiment.

In the example of FIG. 11, the first power supply line 41 and the second power supply line 42 are connected to the first electrodes E1 and the second electrodes E2 through a first branch power supply line 41a and a second branch power supply line 42a that are branched off from the first power supply line 41 and the second power supply line 42, respectively. The first branch power supply line 41a and the second branch power supply line 42a are located between the first power supply line 41 and the display region DA and surround the display region DA. Both end portions of the first branch power supply line 41a are connected to the first power supply line 41 through a first contact hole CH1. Both end portions of the second branch power supply line 42a are connected to the second power supply line 42 through a second contact hole CH2.

The electrodes E1 and E2 provided in the first to third regions A1 to A3 and the electrodes E2 provided in the fifth and sixth regions A5 and A6 are disposed immediately above the branch power supply lines 41a and 42a, respectively. Each of the electrodes E1 and E2 provided in each of the first to third regions A1 to A3 has a rectangular shape. Each of the electrodes E2 provided in each of the fifth and sixth regions A5 and A6 has a substantially square shape obtained by cutting off a corner portion closer to the display region DA. Each of the first electrodes E1 is connected to the first branch power supply line 41a through the first contact hole CH1 and is connected to the first power supply line 41. Each of the second electrodes E2 is connected to the second branch power supply line 42a through the second contact hole CH2 and is connected to the second power supply line 42.

In the example of FIG. 11, the electrodes E1 and E2 provided in the first to third regions A1 to A3 and the electrodes E2 provided in the fifth and sixth regions A5 and A6 are disposed at positions closer to the display region DA than the power supply lines 41 and 42, respectively. In this case, the ions in the liquid crystal layer LC of the display region DA are attracted to each of the electrodes E1 and E2 without being affected by an electric field generated by each of the power supply lines 41 and 42.

Therefore, also in the display device 1 according to the present third embodiment, as similar to the above-described first and second embodiments, the positive ions in the liquid crystal layer LC can be attracted to the first electrode E1 to which the first voltage V1 of the negative polarity is applied. Similarly, the negative ions in the liquid crystal layer LC can be attracted to the second electrode E2 to which the second voltage V2 of the positive polarity is applied. In this manner, by separately trapping both of the positive ions and the negative ions by the electrodes E1 and E2 disposed in the peripheral region SA, it is difficult to cause the ion-concentrated region. Therefore, the black unevenness and others caused by the concentrated ions can be suppressed, and the display quality can be improved. Particularly, in the present third embodiment, by trapping the ions by both of the electrode E1 and E2 that are alternately disposed in not only the first to third regions A1 to A3 but also the fifth region A5 and the sixth region A6, the trapping capability can be further improved, so that the display quality can be further improved.

Fourth Embodiment

A display device according to the present fourth embodiment is described with reference to FIGS. 12A to 13. In the present fourth embodiment, differences from the first to third embodiments described above are mainly described.

<Configuration of Electrode>

FIGS. 12A and 12B are plan views each schematically illustrating an example of a configuration of an electrode in a display device 1 according to the present fourth embodiment. In FIGS. 12A and 12B, FIG. 12A illustrates the first substrate SUB1, and FIG. 12B illustrates the second substrate SUB2. FIG. 13 is a cross-sectional view schematically illustrating an example of a cross-sectional structure of the display device 1 according to the present fourth embodiment.

In the display device 1 according to the present fourth embodiment, the peripheral region SA includes a first region A1, a second region A2, a third region A3, and a fourth region A4, that are provided on the first substrate SUB1, and a first region A1, a second region A2, a third region A3, and a fourth region A4, that are provided on the second substrate SUB2. The first regions A1 and the second regions A2 that are provided on the first substrate SUB1 and the second substrate SUB2 sandwich the display region DA. The third regions A3 and the fourth regions A4 that are provided on the first substrate SUB1 and the second substrate SUB2 are disposed in a direction (Y direction) different from a direction in which the first regions A1 and the second regions A2 are disposed (X direction) and sandwich the display region DA. Note that the peripheral region SA may also include not only the first to fourth regions A1 to A4 but also the fifth to eighth regions A5 to A8 as similar to the above-described second embodiment.

In the display device 1 according to the present fourth embodiment, the first electrode E1 is provided in either one of the first to fourth regions that are provided on the first substrate SUB1 and the first to fourth regions that are provided on the second substrate SUB2. The second electrode E2 is provided in the other of the first to fourth regions that are provided on the first substrate SUB1 and the first to fourth regions that are provided on the second substrate SUB2. In the example of FIGS. 12A and 12B, the first electrode E1 is provided in the first to third regions A1 to A3 that are provided on the first substrate SUB1, and the second electrode E2 is provided in the first to third regions A1 to A3 that are provided on the second substrate SUB2. On the other hand, note that the first electrode E1 may be provided in the first to third regions A1 to A3 provided on the second substrate SUB2, and the second electrode E2 may be provided in the first to third regions A1 to A3 provided on the first substrate SUB1.

Since various wirings and circuits including the video driver SD are provided in the fourth region A4, the space in the region is small. Accordingly, in the example of FIGS. 12A and 12B, the first electrode E1 and the second electrode E2 are not provided in the fourth region A4. If the space can be secured in the fourth region A4, note that the first electrode E1 or the second electrode E2 may be disposed also in the fourth region A4.

The voltage supply wiring 4 (each of the power supply lines 41 and 42) provided in the peripheral region SA surrounds the display region DA, coincides with an extending direction of the video signal lines S (Y direction) in the first region A1 and the second region A2, and coincides with an extending direction of the scanning signal lines G (X direction) in the third region A3. Accordingly, the first electrode E1 provided in each of the first region A1 and the second region A2 on the first substrate SUB1 and second electrode E2 provided in each of the first region A1 and the second region A2 on the second substrate SUB2 extend in the Y direction, and the first electrode E1 provided in the third region A3 on the first substrate SUB1 and second electrode E2 provided in the third region A3 on the second substrate SUB2 extend in the Y direction.

The first electrode E1 provided on the first substrate SUB1 is connected to the first power supply line 41. The second electrode E2 provided on the second substrate SUB2 is connected to the second power supply line 42. That is, the first voltage V1 of the negative polarity is supplied to the first electrode E1, and the second voltage V2 of the positive polarity is supplied to the second electrode E2.

Figure 13:
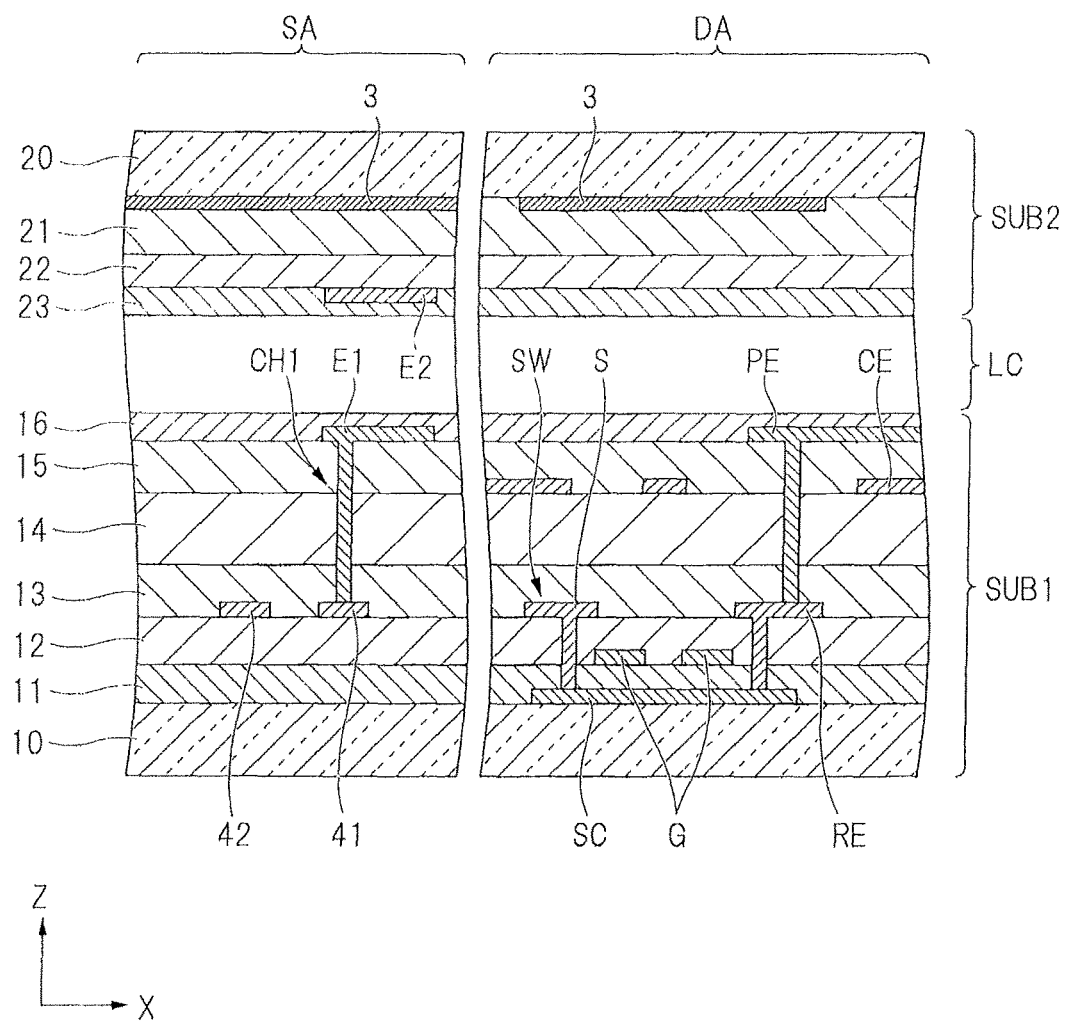
FIG. 13 is a cross-sectional view schematically illustrating an example of a cross-sectional structure of the display device according to the fourth embodiment.

In the example of FIG. 13, in the peripheral region SA of the first substrate SUB1, the first electrode E1 is formed on the fifth insulating layer 15. The fifth insulating layer 15 and the first electrode E1 are covered with the first orientation film 16. The first orientation film 16 is in contact with the liquid crystal layer LC. In the peripheral region SA of the second substrate SUB2, the second electrode E2 is formed on the overcoat layer 22. The overcoat layer 22 and the second electrode E2 are covered with the second orientation film 23. The second orientation film 23 is in contact with the liquid crystal layer LC.

In the example of FIG. 13, each of the electrodes E1 and E2 provided in the peripheral region SA of each of the first substrate SUB1 and the second substrate SUB2 is disposed at a position closer to the liquid crystal layer LC than each of the power supply lines 41 and 42. Accordingly, an electric field of each of the electrodes E1 and E2 easily acts on the liquid crystal layer LC and can favorably trap the ions in the liquid crystal layer LC.

Therefore, also in the display device 1 according to the present fourth embodiment, as similar to the above-described first to third embodiments, the positive ions in the liquid crystal layer LC can be attracted to the first electrode E1 to which the first voltage V1 of the negative polarity is applied. Similarly, the negative ions in the liquid crystal layer LC can be attracted to the second electrode E2 to which the second voltage V2 of the positive polarity is applied. In this manner, by separately trapping both of the positive ions and the negative ions by the electrodes E1 and E2 disposed in the peripheral region SA, it is difficult to cause the ion-concentrated region. Therefore, the black unevenness and others caused by the concentrated ions can be suppressed, and the display quality can be improved. Particularly, in the present fourth embodiment, by trapping the ions by the first electrode E1 provided on the first substrate SUB1 and the second electrode E2 provided on the second substrate SUB2, the trapping capability can be further increased, so that the display quality can be further improved.

In the foregoing, the invention made by the present inventor has been concretely described based on the embodiments. However, it is needless to say that the present invention is not limited to the foregoing embodiments and various modifications and alterations can be made within the scope of the present invention.

For example, in the above-described embodiments, the case of the liquid crystal display device has been exemplified as the disclosure example. However, as another application example, various types of flat-panel display devices such as an organic EL display device, other self-luminous type display device, and an electronic-paper type display device having an electrophoretic element can be exemplified. And, it is needless to say that the present invention is applicable to display devices ranging from small- or middle-sized one to large one without any particular limitation.

In the scope of the concept of the present invention, various modification examples and alteration examples could have been easily anticipated by those who skilled in the art, and it would be understood that these various modification examples and alteration examples belong to the scope of the present invention.

For example, the ones obtained by appropriate addition, removal, or design-change of the components to/from/into each of the above-described embodiments by those who skilled in the art or obtained by addition, omitting, or condition-change of the step to/from/into each of the above-described embodiments are also within the scope of the present invention as long as they include the concept of the present invention.

What is claimed is:

1. A display device including: a first substrate; a second substrate facing the first substrate; and a liquid crystal layer disposed between the first substrate and the second substrate, comprising:
    a display region and a peripheral region outside of the display region;
    the display region having:
        a plurality of scanning signal lines;
        a plurality of video signal lines intersecting the plurality of scanning signal lines;
        a plurality of pixel regions partitioned by the plurality of scanning signal lines and the plurality of video signal lines; and
    the peripheral region having:
        a light shielding layer overlapped on the peripheral region;
        a voltage supply wiring;
        a scanning driver connected to the voltage supply wiring; and
        a first electrode and a second electrode and connected to the voltage supply wiring, wherein the peripheral region includes a first region, a second region, a third region, a fourth region, a fifth region, and a sixth region, the fifth region is a region at a corner between the first region and the third region, the sixth region is a region at a corner between the second region and the third region, in at least each of the first to third regions, a plurality of the first electrodes and a plurality of the second electrodes are provided, in at least each of the fifth and sixth regions, either the first electrode or the second electrode is provided, and a polarity of a first voltage supplied to the first electrode is different from a polarity of a second voltage supplied to the second electrode.

2. The display device according to claim 1, wherein the voltage supply wiring includes a first power supply line to which the first voltage is supplied and a second power supply line to which the second voltage is supplied, the scanning driver selectively supplies the first voltage or the second voltage to the plurality of scanning signal lines, and the first electrode is connected to the first power supply line while the second electrode is connected to the second power supply line.

3. The display device according to claim 1, wherein each of the first electrode and the second electrode is disposed at a position closer to the liquid crystal layer than the voltage supply wiring.

4. The display device according to claim 1, wherein the voltage supply wiring includes a first power supply line to which the first voltage is supplied and a second power supply line to which the second voltage is supplied, the first electrode is connected to the first power supply line while the second electrode is connected to the second power supply line, the first power supply line is disposed between the second power supply line and the display region in a plan view, and the first electrode and the second electrode are disposed between the first power supply line and the display region in a plan view.

5. The display device according to claim 1, wherein shapes of the first electrode and the second electrode in the first to fourth regions are different from shapes of the first electrode and the second electrode in the fifth and sixth regions.

* * * * *